United States Patent
Wong et al.

(10) Patent No.: US 12,028,089 B2
(45) Date of Patent: *Jul. 2, 2024

(54) CIRCUIT APPARATUS FOR CONVERTING DIGITAL SIGNALS TO ANALOG SIGNALS INCLUDING DIFFERENT MODE DRIVER CIRCUITS

(71) Applicant: JARIET TECHNOLOGIES, INC., Redondo Beach, CA (US)

(72) Inventors: Ark-Chew Wong, Irvine, CA (US); Richard Dennis Alexander, Lake Forest, CA (US)

(73) Assignee: JARIET TECHNOLOGIES, INC., Redondo Beach, CA (US)

(*) Notice: Subject to any disclaimer, the term of this patent is extended or adjusted under 35 U.S.C. 154(b) by 204 days.

This patent is subject to a terminal disclaimer.

(21) Appl. No.: 17/371,011

(22) Filed: Jul. 8, 2021

(65) Prior Publication Data

US 2021/0336631 A1 Oct. 28, 2021

Related U.S. Application Data

(63) Continuation of application No. 16/834,040, filed on Mar. 30, 2020, now Pat. No. 11,088,703, which is a
(Continued)

(51) Int. Cl.
*H03M 1/00* (2006.01)
*H03M 1/68* (2006.01)
(Continued)

(52) U.S. Cl.
CPC ............ *H03M 1/68* (2013.01); *H03M 1/747* (2013.01); *H03M 1/765* (2013.01); *H03M 1/785* (2013.01)

(58) Field of Classification Search
CPC ........ H03M 1/68; H03M 1/747; H03M 1/765; H03M 1/785; H03M 1/742; H03M 1/76
(Continued)

(56) References Cited

U.S. PATENT DOCUMENTS

| 4,796,230 A | 1/1989 | Young |
| 8,786,478 B1* | 7/2014 | Choi ................... H03M 1/0863 341/120 |

(Continued)

FOREIGN PATENT DOCUMENTS

EP 2592755 5/2013

OTHER PUBLICATIONS

Ma et al., "A 12-bit 1.74-mW 20-MS/s DAC with resistor-string and current-steering hybrid architecture," 2015 28th IEEE International System-on-Chip Conference, Sep. 2015, 6 pages.
(Continued)

*Primary Examiner* — Jean B Jeanglaude
(74) *Attorney, Agent, or Firm* — Morgan, Lewis & Bockius LLP

(57) ABSTRACT

A hybrid digital-to-analog converter (DAC) driver circuit includes a current-mode DAC driver, a voltage-mode DAC driver, and a combination circuit. The current-mode DAC driver may be configured to receive a first set of bits of a digital input signal and to generate a first analog signal. The voltage-mode DAC driver may be configured to receive a second set of bits of the digital input signal and to generate a second analog signal. The combination circuit may be configured to combine the first analog signal and the second analog signal and to generate an analog output signal. The DAC driver circuit may be terminated by adjusting resistor values of the voltage-mode DAC driver. The current-mode
(Continued)

DAC driver and the voltage-mode DAC driver are differential drivers, and may be configured to operate with a single clock signal.

20 Claims, 11 Drawing Sheets

Related U.S. Application Data continuation of application No. 16/085,976, filed as application No. PCT/US2017/025089 on Mar. 30, 2017, now Pat. No. 10,608,662.

(60) Provisional application No. 62/315,583, filed on Mar. 30, 2016.

(51) Int. Cl.
    *H03M 1/74* (2006.01)
    *H03M 1/76* (2006.01)
    *H03M 1/78* (2006.01)

(58) Field of Classification Search
    USPC .......................................................... 341/126
    See application file for complete search history.

(56) References Cited

U.S. PATENT DOCUMENTS

| | | | |
|---|---|---|---|
| 9,275,598 B2 | 3/2016 | Tu | |
| 9,413,381 B2 | 8/2016 | Vasani | |
| 10,270,462 B2 | 4/2019 | Aoki | |
| 2001/0026236 A1 | 10/2001 | Toda | |
| 2003/0128142 A1 | 7/2003 | Khalil et al. | |
| 2006/0092062 A1 | 5/2006 | Pan | |
| 2007/0001888 A1 | 1/2007 | Draxelmayr | |
| 2007/0103186 A1 | 5/2007 | Clements et al. | |
| 2008/0034378 A1 | 2/2008 | Kumar et al. | |
| 2008/0122672 A1 | 5/2008 | Chang et al. | |
| 2014/0167993 A1* | 6/2014 | Chiang | H03M 1/089 341/145 |

OTHER PUBLICATIONS

Park et al., "A 3.3-V :pw-Power Compact Driver for Multi-Standard Physical Layer," Journal of Semiconductor Technology and Science, Mar. 2007, vol. 10, No. 23, pp. 36-42.
Extended European Search Report dated Dec. 2, 19 from European Patent Application No. 17776673.0, 10 pages.
Bassi, et al., "3.6 A 45Gb/s PAM-4 transmitter delivering 1.3Vppd output swing with 1V supply in 28 nm CMOS FDSOI," 2016 IEEE International Solid State Circuits Conference, Jan. 2016, pp. 66-67.
Sedighi, et al., "Design of hybrid resistive-capacitive DAC for SAR A/D converters," 19th IEEE International Conference on Electronics, Circuits and Systems, Dec. 2012, pp. 508-511.
European Office Action from European Patent Application No. 17776673.0, dated Dec. 14, 2021, 12 pages.

* cited by examiner

US 12,028,089 B2

CIRCUIT APPARATUS FOR CONVERTING DIGITAL SIGNALS TO ANALOG SIGNALS INCLUDING DIFFERENT MODE DRIVER CIRCUITS

CROSS-REFERENCE TO RELATED APPLICATIONS

This application is a continuation of U.S. patent application Ser. No. 16/834,040, filed on Mar. 30, 2020, now U.S. Pat. No. 11,088,703, which is a continuation of U.S. patent application Ser. No. 16/085,976, filed on Sep. 17, 2018, now U.S. Pat. No. 10,608,662, which is a national stage of Application No. PCT/US2017/025089, filed on Mar. 30, 2017, which claims the benefit of U.S. Provisional Application No. 62/315,583, filed on Mar. 30, 2016, the entirety of each of which is incorporated herein by reference for all purposes.

TECHNICAL FIELD

The present description relates in general to digital-to-analog conversion systems, and more particularly to, for example, without limitation, digital-to-analog conversion systems with voltage-mode and current-mode drivers.

BACKGROUND

Digital-to-analog converter (DAC) circuits are commonly used to convert digital signals to analog signals. Example applications of DAC circuits are in communication devices and systems. For instance, almost all communication devices such as hand-held communication devices including smart phones, tablets, phablets, and other communication devices employ one or more DAC circuits. DAC circuits are characterized by properties such as resolution, accuracy, and maximum sampling frequency, and can be implemented in integrated circuits based on a number of different architectures.

The description provided in the background section should not be assumed to be prior art merely because it is mentioned in or associated with the background section. The background section may include information that describes one or more aspects of the subject technology.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

Figure 1:
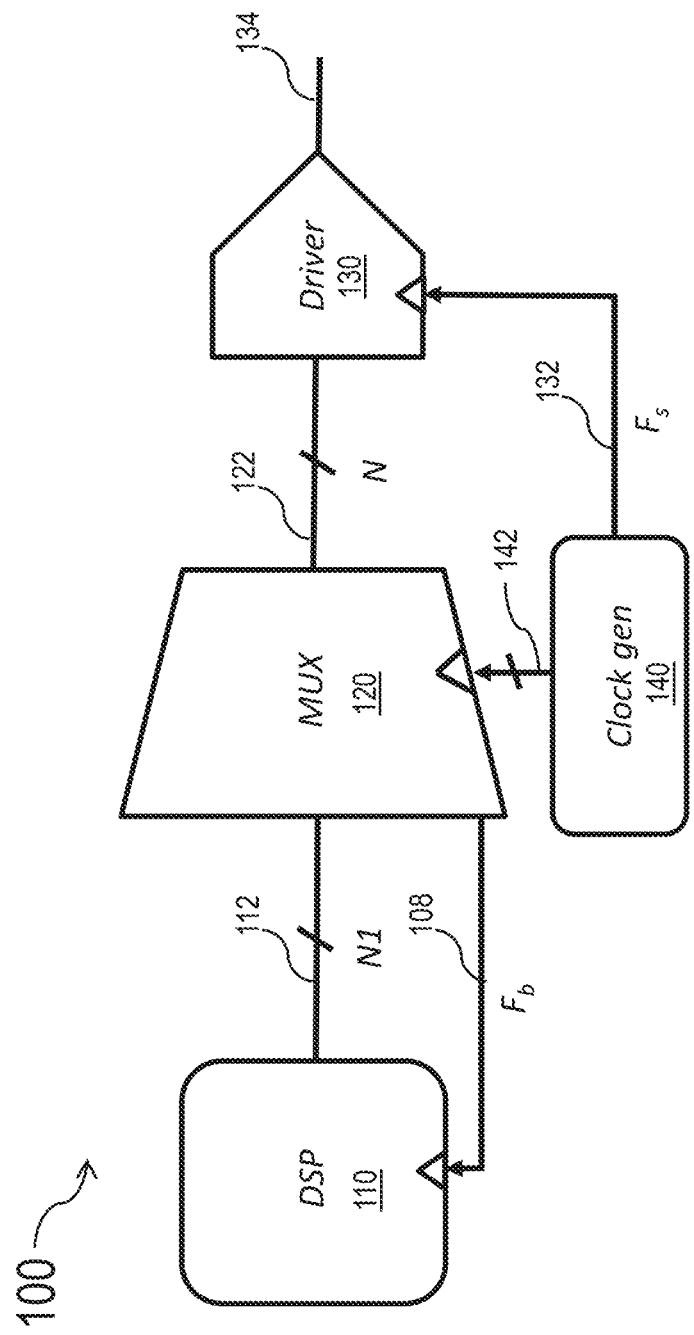
FIG. 1 is a block diagram illustrating an example of a digital-to-analog conversion (DAC) system.

FIG. 1 is a block diagram illustrating an example of a digital-to-analog conversion (DAC) system 100. The DAC system 100 includes a digital signal processor circuit (DSP) 110, a multiplexer (MUX) circuit 120, a clock generation circuit 140, and a DAC driver circuit 130. The MUX circuit 120 may be utilized to convert a digital baseband signal 112 of the DSP 110 to a digital signal 122. The digital baseband signal 112 may have N1 bits that are converted to N bits of the digital signal 122 by the MUX circuit 120. The MUX circuit 120 operates based on a clock signal 142 of the clock generator circuit 140. The DSP 110 receives a baud rate 108 (e.g., $F_b$) from the MUX circuit 120 and presents the digital baseband signal 112 to MUX circuit 120 at a rate equal to the baud rate 108 (e.g., $F_b$). The sampling rate ($F_s$) of the DAC driver circuit 130 can be set by the clock signal 132 of the clock generator circuit 140. In an aspect, the relation between N1 and N can be expressed as $N1=N(F_s/F_b)$. The DAC system 100 may generate an analog signal 134 based on the N bits of the digital signal 122. For instance, the DAC system 100 may convert the N bits into an analog representation of the N bits. In an aspect, the analog signal 134 may be output from the DAC driver circuit 130 for use by another circuit, for example, an amplifier or a filter.

Figure 2A:
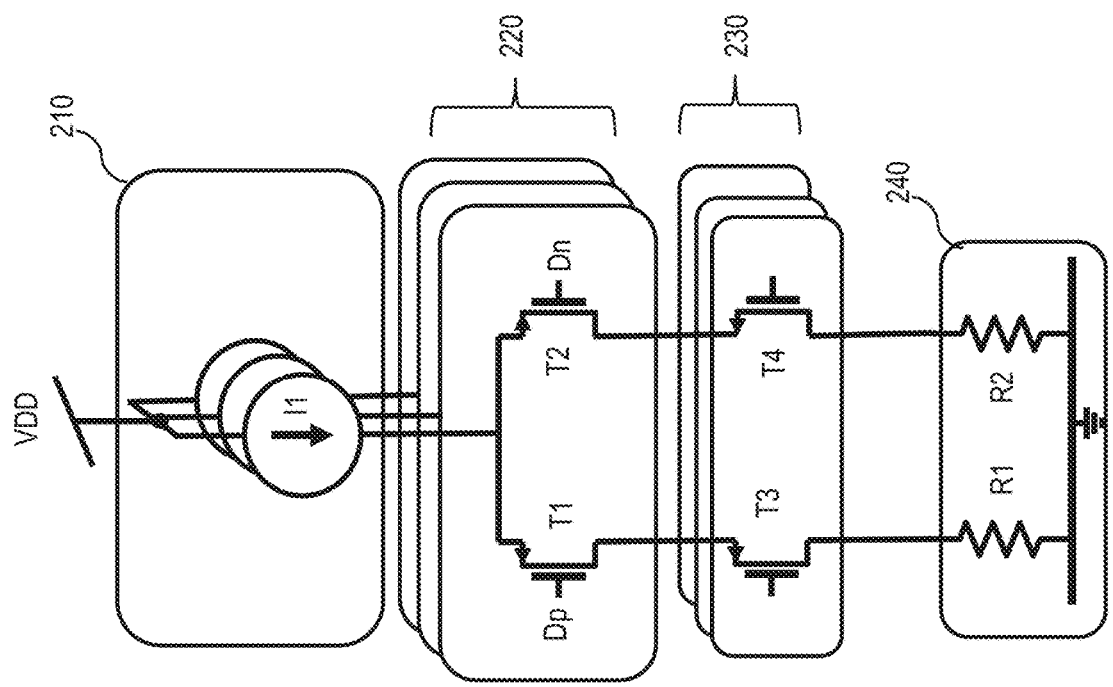
FIGS. 2A and 2B illustrate examples of current-mode DAC driver circuits.

FIG. 2A illustrates an example of a current-mode DAC driver circuit 200A. In an aspect, the current-mode DAC driver circuit 200A may be referred to as a current-steering DAC driver circuit, a straight common-mode logic-based (CML-based) current-steering DAC driver circuit, an I-DAC driver circuit, or a variant thereof (e.g., CML-based DAC driver circuit). The current-mode DAC driver circuit 200A may be utilized as the DAC driver circuit 130 in FIG. 1. The various components of the current-steering DAC driver circuit 200A are stacked. The current-mode DAC driver circuit 200A may include sets of cascode devices 230, sets of data switches 220, and tail current sources 210. The sets of cascode devices 230 may be connected to a load network 240. The load network 240 may be a resistive load network that includes load resistors such as R1 and R2. In some cases, the load network 240 may further include reactive components (not shown), such as capacitances and inductances. In one aspect, the load network 240 may include one or more transistor devices. In an aspect, an output of the current-mode DAC driver circuit 200A may be between the load network 240 and the sets of cascode devices 230. The cascode devices 230 may be referred to simply as cascodes 230. The tail current sources 210 form a tail current array coupled in parallel to a voltage source VDD.

Each set of data switches 220 may include at least one pair of data switches. The data switches that form each set of data switches may be transistor devices, for example, MOS transistors T1 and T2 such as PMOS transistors. One of the data switches (e.g., T1) in each set may receive a datap (Dp) signal at a terminal (e.g., a gate terminal) and the other of the data switches (e.g., T2) in each set may receive a datan (Dn) signal. The Dp and Dn signals may be generated based on (e.g., derived from) the N bits received by the DAC driver circuit 200A. In an aspect, the Dp signal and the Dn signal are complementary signals. For example, when the Dp signal is in a high state (e.g., higher voltage, logic high, or '1' state), the Dn signal is in a low state associated with a lower voltage (e.g., lower voltage, logic low, or '0' state). In some cases, a data switch (e.g., T1 or T2) is turned on when the applied data signal (e.g., Dp or Dn) is in the low state and is turned off when the applied data signal is in the high state, or vice versa. Each set of the various sets of data switches may be connected to one of the tail current sources (e.g., I1) that form the tail current array 210 and one of the sets of cascode devices 230. In an aspect, the current-steering DAC driver circuit 200A includes N sets of two data switches (e.g., 2N individual data switches), N sets of cascode devices (e.g., 2N individual cascode devices), and N tail current sources. In an aspect not shown in FIG. 2A, each set of the various sets of data switches may be connected to a same common pair of cascode devices.

As used herein, transistor devices, which may be utilized in current sources 210, cascode devices 230, and/or the data switches 220, may be or may include metal-oxide-semiconductor (MOS) transistor devices, such as metal-oxide-semiconductor field effect transistor (MOSFET) devices. In FIG. 2A, the data switches (e.g., T1 and T2) and the cascode devices (e.g., T3 and T4) may be or may include p-type MOS (PMOS) devices. In an aspect, the tail current sources may be or may include PMOS devices.

Figure 2B:
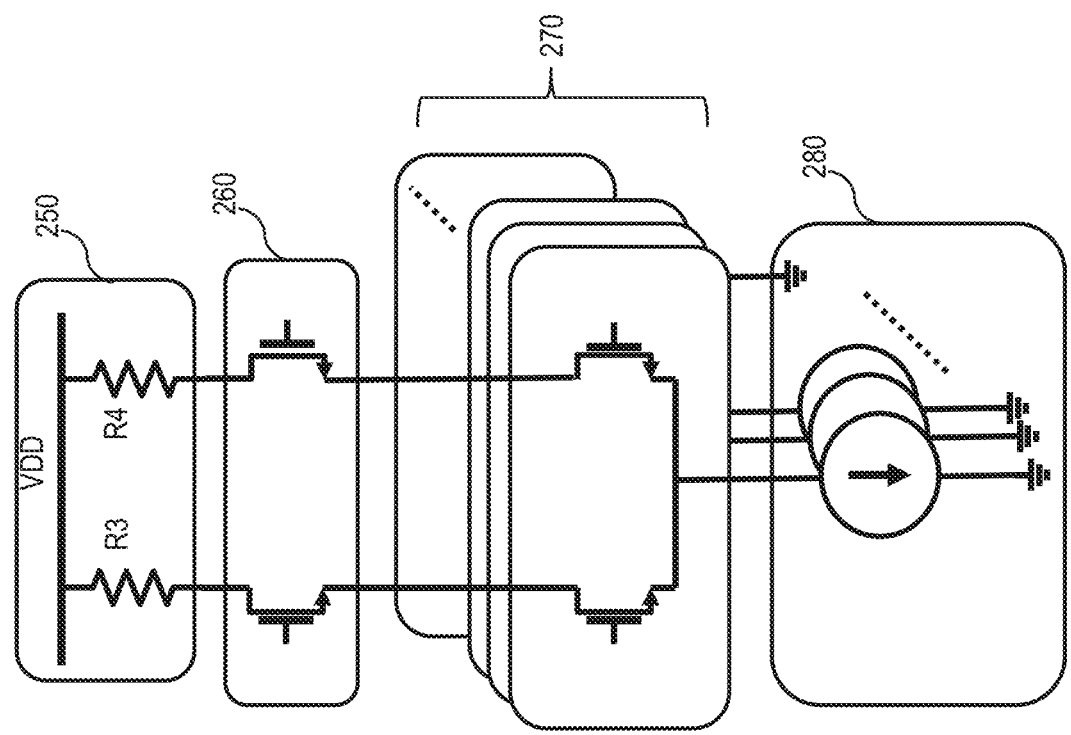

FIG. 2B illustrates an example of a current-mode DAC driver circuit 200B. The description from FIG. 2A generally applies to FIG. 2B, with examples of differences between FIG. 2A and FIG. 2B provided herein for purposes of clarity and simplicity. In FIG. 2B, the sets of data switches 270 cascode devices 260 and/or tail current sources 280 may be n-type MOS (NMOS) devices. The cascode devices 260 may be shared by the sets of data switches. In an aspect not shown in FIG. 2B, each set of data switches may be connected to a corresponding set of cascode devices.

In some aspects, the current-mode DAC driver circuit 200B may include large cascode transistors. In some cases, the large cascode transistors may be utilized to facilitate matching. In an aspect, the matching may refer to allowing the tail current sources (e.g., 210 and 280 FIGS. 2A and 2B, respectively) to provide the same or similar current. In an aspect, the current-mode DAC driver circuit 200B may allow for matching above 8 bits if input data. In cases where the large cascode transistors are utilized in an interleaved structure, the interleaved structure may cause the capacitive load seen by the clock generation circuits to be higher. In some cases, the large cascode transistors may limit bandwidth at an output of the current-mode DAC driver circuit 200B. For instance, the bandwidth may be limited due to parasitics associated with the large cascode transistors. To accommodate for (e.g., drive) the parasitic capacitances, larger clock generation circuits may be utilized. In an aspect, the larger clock generation circuits may be associated with higher power usage and/or higher phase noise. The subject technology combines the current-mode DAC driver with a voltage-mode DAC driver in a hybrid configuration, as discussed herein.

Figure 3:
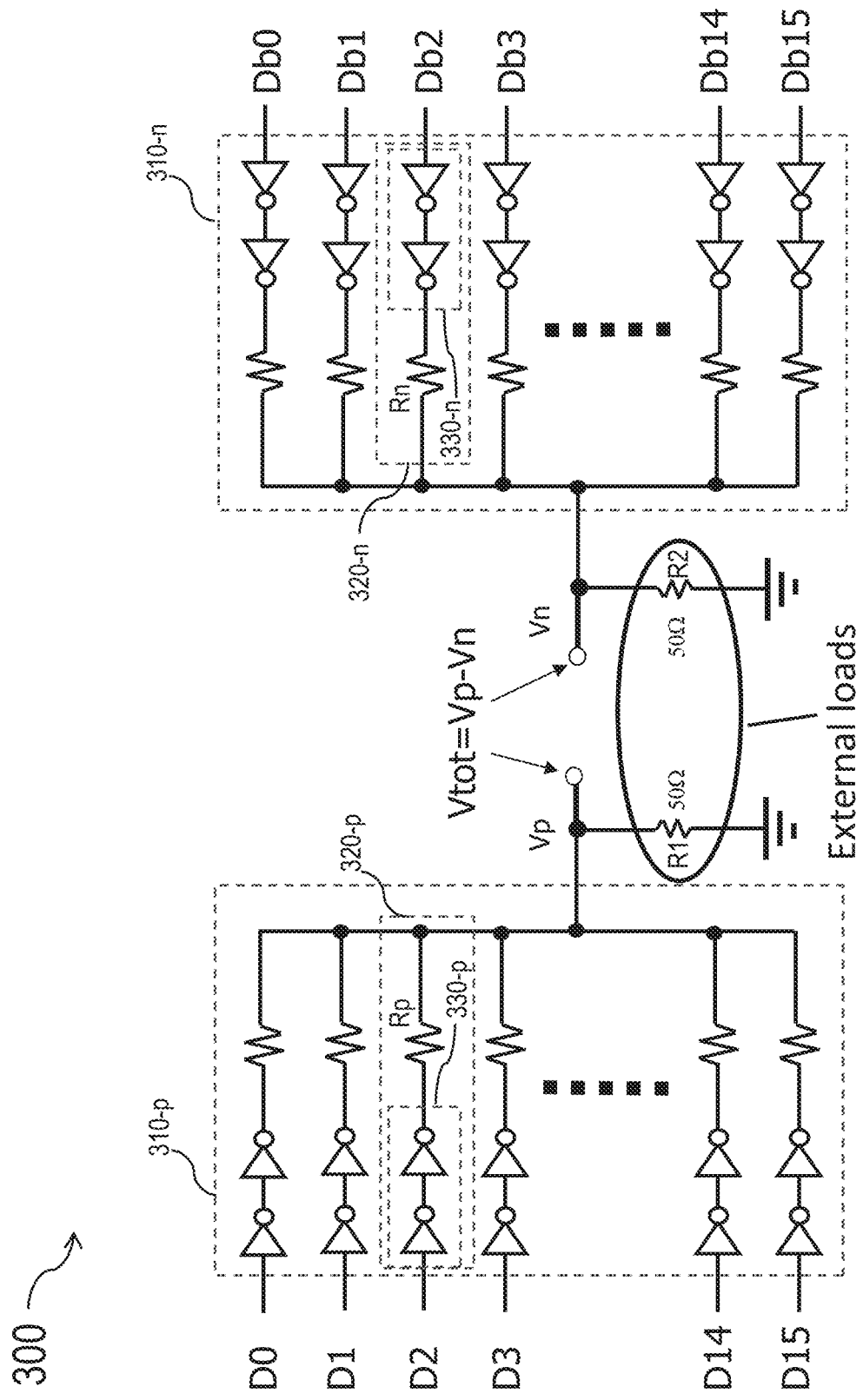
FIG. 3 illustrates an example of a voltage-mode DAC driver circuit coupled to an external differential load.

FIG. 3 illustrates an example of a voltage-mode DAC driver circuit 300 coupled to an external differential load. In an aspect, the voltage-mode DAC driver circuit 300 may be referred to as a V-DAC driver circuit, resistive DAC driver circuit, or R-DAC driver circuit. In some aspects, the voltage-mode DAC driver circuit 300 may be utilized as the DAC driver circuit 130 in FIG. 1.

The voltage-mode DAC driver circuit 300 may include a first portion 310-$p$ and a second portion 310-$n$, with each portion including multiple parallel paths. The output of the first portion 310-$p$ and the second portion 310-$n$ is represented as $V_p$ and $V_n$, respectively. The differential output voltage of the voltage-mode DAC driver circuit 300 is represented as $V_{tot}=V_p-V_n$. In FIG. 3, the external loads (e.g., R1 and R2) are 50Ω resistances.

Each path (e.g., 320-$p$ or 320-$n$) may include a buffering circuit (e.g., 330-$p$ or 330-$n$), for example, inverter circuits or non-inverting buffering circuits) and a resistor (e.g., Rp or Rn). For example, in FIG. 3, each path includes two inverter circuits and a resistor. Each path 320-$p$ of the first portion 310-$p$ may receive a respective data signal of the data signals represented as D0, D1, D2, D3, . . . , D14, and D15. Each path 320-$n$ of the second portion 310-$n$ may receive a respective data signal of the data signals represented as Db0, Db1, Db2, Db3, Db14, and Db15. The data signals may be generated based on (e.g., derived from) the N bits received by the DAC driver circuit (e.g., 130 of FIG. 1). In an aspect, the voltage-mode DAC driver circuit 300 shown in FIG. 3 may be associated with 4 bits, 16 bits, or other number of bits depending on the application. In an aspect, each path 320-$p$ of the first portion 310-$p$ may have a corresponding path in the second portion, in which the data signal for a path of the first portion and the data signal for a corresponding path of the second portion are complementary signals. For example, D0 and Db0 may be complementary signals, D1 and Db1 may be complementary signals, D15 and Db15 may be complementary signals, and so forth.

In an aspect, the voltage-mode DAC driver circuit 300 may allow for matching for up to about 8 bits. For the voltage-mode DAC driver circuit 300, the matching may refer to matching of the resistors Rp and Rn with load resistors R1 and R2, respectively. In an aspect, the voltage-mode DAC driver circuit 300 may allow for a compact implementation (e.g., smaller chip area. For example, about 20 μm×50 μm). For instance, in some cases, the multiple sets of data switches and/or sets of cascode devices, among other components, of the current-mode DAC driver circuit (e.g., 200A of FIGS. 2A and 200B of 2B) may cause the current-mode DAC driver circuit to be less compact than the voltage-mode DAC driver circuit 300. In an aspect, the voltage-mode DAC driver circuit 300 may allow for higher bandwidth (e.g., about 10 GHz within a range of about 15-20 GHz). In an aspect, the voltage-mode DAC driver circuit 300 may allow for reduced return loss (e.g., within a range of about 12-20 dB). In an aspect, the compactness of the voltage-mode DAC driver circuit 300 may facilitate achieving of the higher bandwidth and/or the reduced return loss.

In one or more implementations, a hybrid-mode DAC driver circuit that includes a current-mode DAC driver circuit (e.g., 200A or 200B) and a voltage-mode DAC driver circuit 300 may be utilized. The hybrid-mode DAC driver circuit may be referred to as a hybrid DAC driver circuit. The hybrid-mode DAC driver circuit may allow for higher bandwidth, reduced return loss, compactness, lower power, and/or improved phase noise performance. In some aspects, the current-mode DAC driver circuit may be a CML-based current-steering DAC driver circuit, of which examples are shown in FIGS. 2A and 2B.

Figure 4:
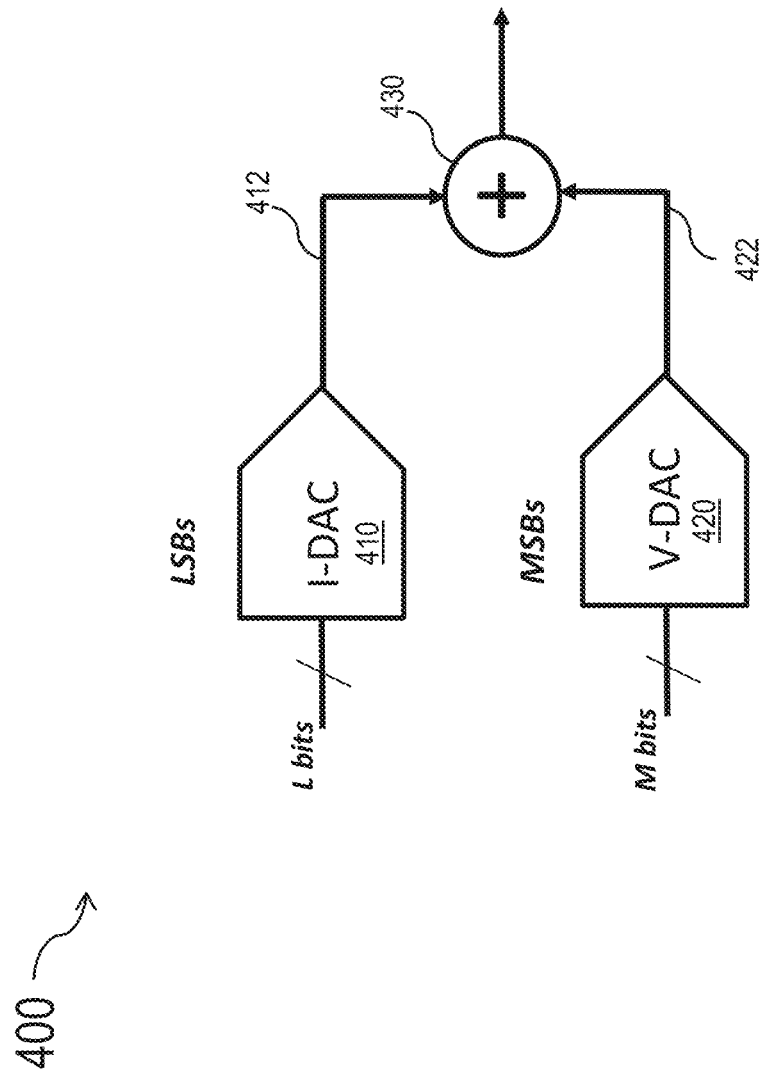
FIG. 4 is a block diagram illustrating an example of a hybrid-mode DAC driver circuit that includes a current-mode DAC driver circuit and a voltage-mode DAC driver circuit.

FIG. 4 is a block diagram illustrating an example of a hybrid-mode DAC driver circuit 400. The hybrid-mode DAC driver circuit 400 may include (e.g., combine) a current-mode DAC driver circuit 410 and a voltage-mode DAC driver circuit 420 using a combination circuit 430. The hybrid-mode DAC driver circuit 400 may be utilized as the DAC driver circuit 130 in FIG. 1.

The hybrid-mode DAC driver circuit 400 may be associated with N DAC bits (where N=M+L), including M most significant bits (MSBs) and L least significant bits (LSBs). In an aspect, M may be 6 and L may be 4 (e.g., for N=10). In another aspect, M may be 8 and L may be 2. In other aspects, other values of M, L, and N may be utilized. For instance, N may be smaller or larger than 10. In an aspect, shown in FIG. 4, the MSBs may be implemented in voltage mode and the LSBs may be implemented in current mode. In an aspect, the current-mode DAC driver circuit 410 generates an analog signal 412 and the voltage-mode DAC driver circuit 420 generates an analog signal 422, which are combined by the combination circuit 430.

The current-mode DAC driver circuit 410 and/or the voltage-mode DAC driver circuit 420 may be implemented using, by way of non-limiting example, binary coding or thermometer coding. The current-mode DAC driver circuit 410 and the voltage-mode DAC driver circuit 420 may utilize the same or different coding.

In an aspect, termination may be determined by the voltage-mode DAC series self-terminated (SST) driver circuit (e.g., 320-$p$ or 320-$n$). In an aspect, the impedance looking from the load into the current-mode DAC driver circuit (e.g., 200A of FIG. 2A or 200B of FIG. 2B) may be high. For instance, the impedance looking into drain nodes of transistors T3 or T4 of FIG. 2A or transistors of the cascode devices 260 of FIG. 2B are quite large and may be considered almost infinite. Thus, the parallel combination of this almost infinite resistance and the equivalent resistance (e.g., parallel combination sum of resistors) of the voltage-mode DAC driver circuit (e.g., 300 of FIG. 3) may be almost equal to the equivalent resistance of the voltage-mode DAC driver circuit. Thus, in such an aspect, the termination may be determined by the equivalent resistance of the voltage-mode DAC driver circuit (e.g., 300 of FIG. 3 or 420 of FIG. 4).

In a case in which current-mode DAC driver circuits are utilized for both the MSBs and LSBs, the transistors (e.g., data switches, cascode devices) associated with each MSB is generally larger than the transistors associated with each LSB. In an aspect, the use of a voltage-mode DAC driver circuit for the MSBs may result in a more compact solution than the use of a current-mode DAC driver circuit for the MSBs. In such an aspect, the loading on clock buffers may be reduced in the case that the voltage-mode DAC driver circuit is used for the MSBs, since the voltage-mode DAC driver circuit has a reduced size relative to the current-mode DAC driver circuit for the MSBs.

Figure 5:
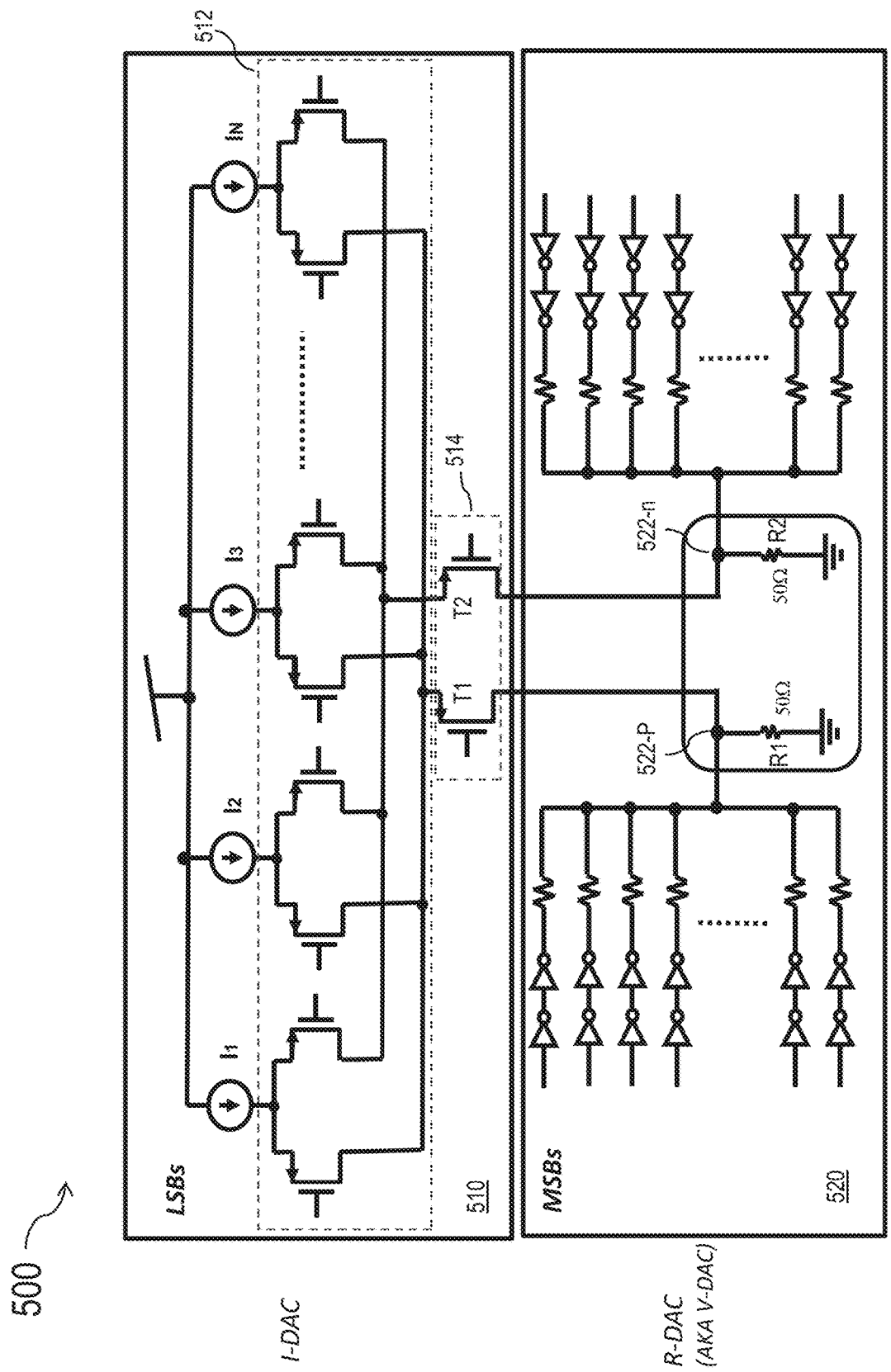
FIG. 5 illustrates an example of hybrid-mode DAC driver circuit.

FIG. 5 illustrates an example of a hybrid-mode DAC driver circuit 500. The hybrid-mode DAC driver circuit 500 may include a current-mode DAC driver circuit 510 and a voltage-mode DAC driver circuit 520. The description from FIGS. 2A-2B with regard to the current-mode DAC driver circuits 200A and 200B generally applies to the current-mode DAC driver circuit 510 of FIG. 5, with examples of differences between the current-mode DAC driver circuits 200A and 200B and 510 FIG. 5 and other description provided herein for purposes of clarity and simplicity.

The current-mode DAC driver circuit 510 and the voltage-mode DAC driver circuit 520 may be associated with LSBs and MSBs, respectively. For instance, the current-mode DAC driver circuit 510 may be associated with L LSBs and the voltage-mode DAC driver circuit 520 may be associated with M MSBs. The current-mode DAC driver circuit 510 may include sets of data switches 512, tail current sources $I_1, I_2, I_3 \ldots I_N$, and a pair of cascode devices 514. In one or more aspects, the pair of cascode devices 514 may be shared by the sets of data switches 512. In some aspects, the drain nodes of the transistors T1 and T2 of the pair of cascode devices 514 may be connected to the output nodes 522-$p$ and 522-$n$ of the voltage-mode DAC driver circuit 520. In an aspect, as shown in FIG. 5, the tail current sources $I_1, I_2, I_3 \ldots I_N$, may utilize binary coding. In this regard, the tail current sources may have currents of L/2, $L/2^2$, $L/2^3$, and so forth, where the last tail current source may have a current of $1/2^L$, and where L is the number of LSBs. In an aspect, since LSBs may be associated with smaller sizes and lower current/power, the cascode devices 514 utilized for the LSBs may be scaled down in size relative to a case in which the current-mode DAC driver circuit is utilized for the MSBs.

The description from FIG. 3 with regard to the voltage-mode DAC driver circuit 300 of FIG. 3 generally applies to the voltage-mode DAC driver circuit 520 of FIG. 5, with examples of differences between the voltage-mode DAC driver circuit 300 and 520 and other description provided herein for purposes of clarity and simplicity. In an aspect, the load network (e.g., 240 and 250) in the current-mode DAC driver circuits of FIGS. 2A-2B may be replaced with the voltage-mode DAC driver circuit 300 of FIG. 3 to form the hybrid-mode DAC driver circuit 500 of FIG. 5. The voltage-mode DAC driver circuit 520 may be coupled to the load network (e.g., external load such as resistors R1 and R2).

Figure 6:
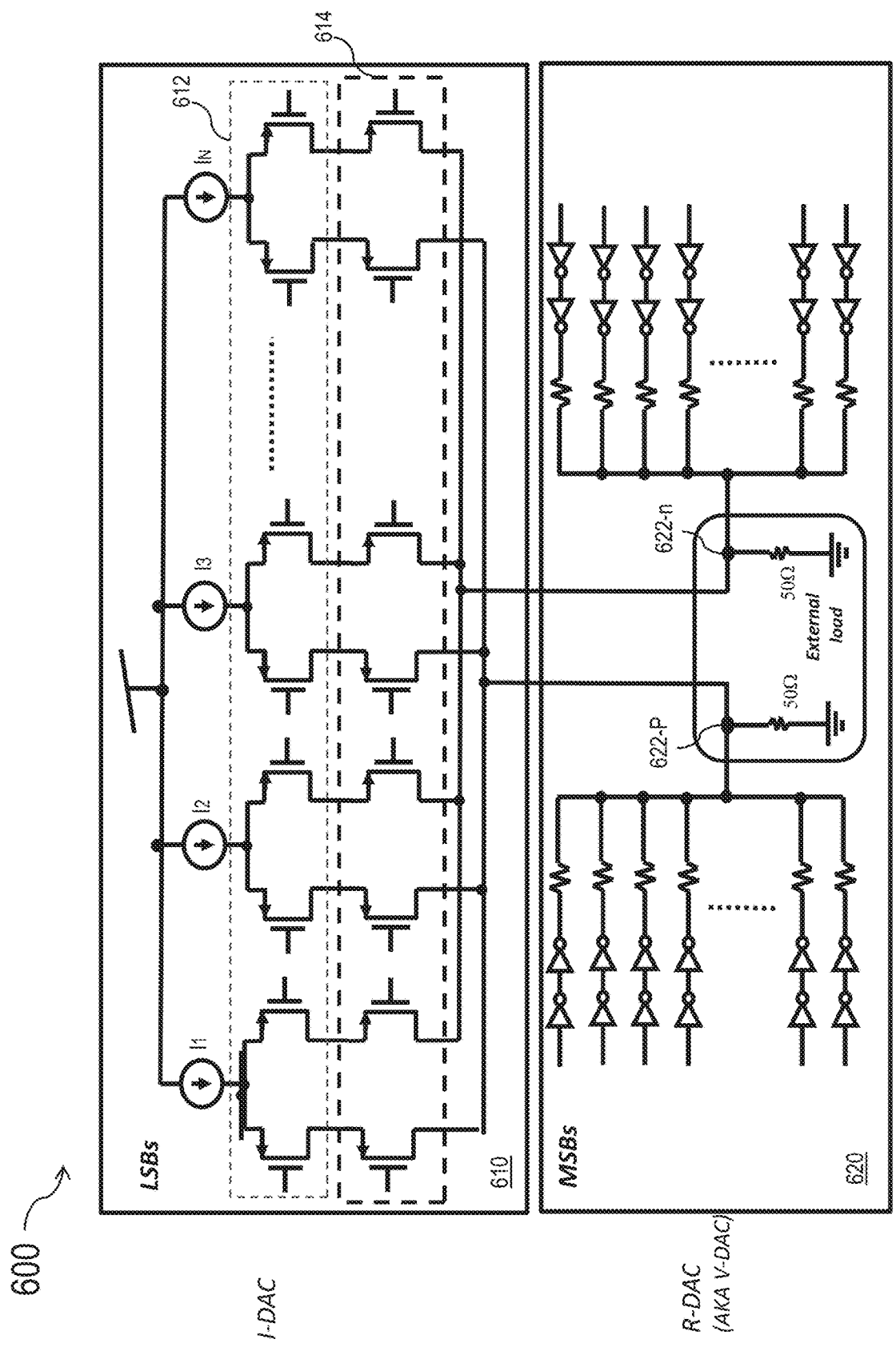
FIG. 6 illustrates an example of hybrid-mode DAC driver circuit.

FIG. 6 illustrates an example of a hybrid-mode DAC driver circuit 600. The hybrid-mode DAC driver circuit of FIG. 6 may be utilized as the DAC driver circuit 130 in FIG. 1. The description from FIG. 5 generally applies to FIG. 6, with examples of differences between FIG. 5 and FIG. 6 and other description provided herein for purposes of clarity and simplicity. In an aspect, the load networks 240 and 250 of FIGS. 2A-2B may be replaced with the voltage-mode DAC driver circuit 300 of FIG. 3 to form the hybrid-mode DAC driver circuit 600 of FIG. 6. In FIG. 6, each set of data switches of the data switch array 612 may be associated with a set of cascode devices of a cascode device array 614. The cascode device array 614 may be connected to the output nodes 622-$p$ and 622-$n$ of the voltage-mode DAC driver circuit 620. In an aspect, the cascode devices of the cascode device array 614 may be scaled down relative to a case in which the current-mode DAC driver circuit 610 is utilized for the MSBs.

In one or more implementations, the hybrid-mode DAC driver circuit 600 may utilize a folded and/or an interleaved architecture, as further described herein. In one or more aspects, the terms architecture, topology, and configuration may be used interchangeably. In some aspects, a folded configuration may allow lower bias voltages to be applied to various components. The folded configuration may help avoid or reduce a headroom issue, avoid or reduce effects of time dependent dielectric breakdown (TDDB), and/or avoid or reduce a need for external direct current (DC) blocking capacitors. The folded configuration, as described herein, may allow for good power supply rejection (PSR).

Figure 7:
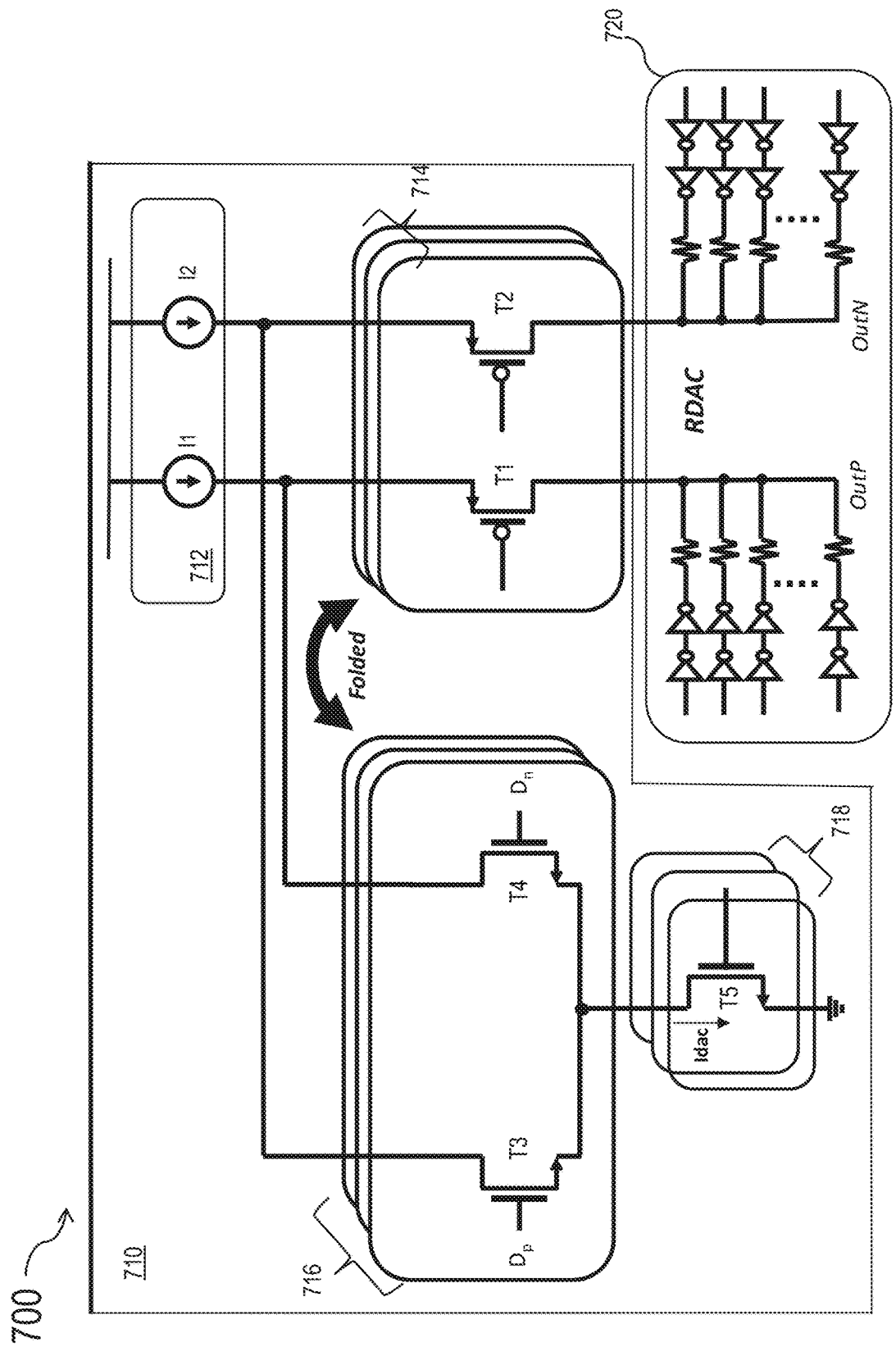
FIG. 7 illustrates an example of a hybrid-mode DAC driver circuit that utilizes a folded architecture.

FIG. 7 illustrates an example of a hybrid-mode DAC driver circuit 700 that utilizes a folded architecture. The hybrid-mode DAC driver circuit 700 of FIG. 7 may be utilized as the DAC driver circuit 130 in FIG. 1. The description from FIG. 3 with regard to the voltage-mode DAC driver circuit 300 generally applies to the voltage-mode DAC driver circuit 720 of FIG. 7, with examples of differences between the voltage-mode DAC driver circuit 300 of FIGS. 3 and 720 and other description provided herein for purposes of clarity and simplicity.

The hybrid-mode DAC driver circuit 700 may include a current-mode DAC driver circuit 710 and the voltage-mode DAC driver circuit 720. The current-mode DAC driver circuit 710 and the voltage-mode DAC driver circuit 720 may be associated with LSBs and MSBs, respectively. The current-mode DAC driver circuit 710 of FIG. 7 may be referred to as a folded DAC driver circuit, a folded current-mode DAC driver circuit, a single folded DAC driver circuit, or a variant thereof (e.g., single folded current-mode DAC driver circuit). The folded current-mode DAC driver circuit 710 may be connected in parallel with the voltage-mode DAC driver circuit 720 to a load network (e.g., external load). The OutP and the OutN of the voltage-mode DAC driver circuit 720 of FIG. 7 may be connected with the load network (e.g., 50Ω resistors).

The folded current-mode DAC driver circuit 700 may include sets of data switches 716, tail current sources 712, sets of cascode devices 714, sets of second current sources 718. While not shown in detail in the figure for the purpose of brevity, the number of sets of data switches 716 is equal to the number of sets of cascode devices 714, is equal to the number of tail current sources 712, and is equal to the number of sets of second current sources 718. Each set of cascode devices 714 may include two cascode devices (e.g., T1 and T2). The sets of data switches 716 may be in a folded configuration relative to the sets of cascode devices 714. In an aspect, each set of data switches may include two data switches (e.g., T3 and T4), with each set of data switches (e.g., T3 and T4) being tied to a respective set of cascode devices (e.g., T1 and T2), respective tail current sources (e.g., $I_1$ and $I_2$), and a respective current source of a set of second current sources 712. The sets of cascode devices 714 may be tied to the voltage-mode DAC driver circuit 720. In an aspect, the folded current-mode DAC driver circuit 710 includes N sets of data switches, N sets of cascode devices, N tail current sources, and N sets of second current sources. In an aspect, the data signals (e.g., $D_p$, $D_n$) applied to the data switches T3 and T4 may be around 0 V (e.g., for a low state) or around 0.9 V (e.g., for a high state).

Figure 8:
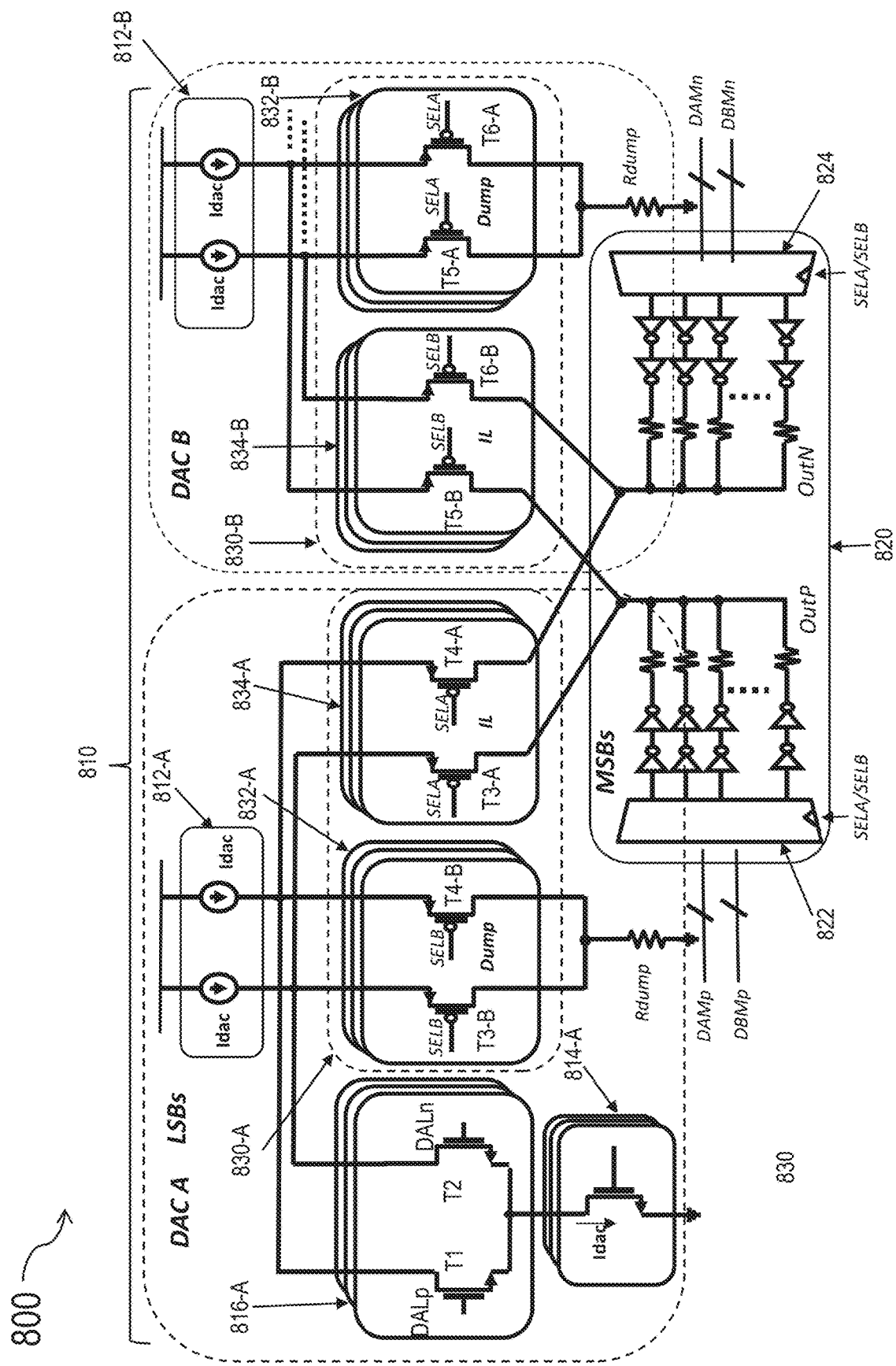
FIG. 8 illustrates an example of a hybrid-mode DAC driver circuit that utilizes a folded and interleaved architecture.

FIG. 8 illustrates an example of a hybrid-mode DAC driver circuit 800 that utilizes a folded and interleaved architecture. The hybrid-mode DAC driver circuit 800 of FIG. 8 may be utilized as the DAC driver 130 in FIG. 1. The description from FIG. 3 with regard to the voltage-mode DAC driver circuit 300 generally applies to the voltage-mode DAC driver circuit 800 of FIG. 8, with examples of differences between the voltage-mode DAC driver circuits 300 and 800 and other description provided herein for purposes of clarity and simplicity.

The hybrid-mode DAC driver circuit 800 may include a current-mode DAC driver circuit 810 and a voltage-mode DAC driver circuit 820. The current-mode DAC driver circuit 810 and the voltage-mode DAC driver circuit 820 may be associated with LSBs and MSBs, respectively. The current-mode DAC driver circuit 810 may be referred to as an interleaved folded current-mode DAC driver circuit, interleave-by-two DAC driver circuit, or variant thereof. The interleaved folded current-mode DAC driver circuit 810 may be connected in parallel with the voltage-mode DAC driver circuit 820 to a load network (e.g., external load). The OutP and the OutN of the voltage-mode DAC driver circuit 820 may be coupled to the load network (e.g., resistors R1 and R2 of FIG. 3).

The interleaved folded current-mode DAC driver circuit 810 may include two or more single current DAC sub-drivers DAC A and DAC B that are connected to and summed through the voltage-mode DAC driver circuit 820.)

DAC A may include sets of data switches 816A, tail current sources 812-A, a set of second current sources 814-A, and interleaving (IL) blocks 830-A. In one or more implementations, the number of sets of data switches 816-A is (a) equal to the number of interleaving blocks 830-A, and (b) equal to the number of sets of second current sources 814-A. Simply for purposes of brevity, as shown FIG. 8, the sets of data switches 816-A include three pair of data switches, the interleaving blocks 830-A include three interleaving blocks, and the set of second current sources 814-A includes three current sources, the tail current sources 812-A includes a pair of tail current sources. FIG. 8, however, does not show other data switches, interleaving blocks, second current sources, and tail current sources for DAC A. The interleaving blocks 830-A includes dump blocks 832-A and output switch blocks 834-A. In each pair of data switches, one data switch receives at a first gate terminal a DALp signal, and another data switch receives at a second gate terminal a DALn signal.

Similar to DAC A, DAC B includes sets of data switches (not shown), tail current sources 812-b, interleaving blocks 830-B including dump network blocks 832-B and output switch blocks 834-B. Similar to DAC A, in DAC B, the number of sets of data switches (not shown), is (a) equal to the number of interleaving blocks 830-B, (b) equal to the number of sets of second current sources (not shown). The respective dump network blocks 832-A and 832-B of DAC A and DAC B may include one or more resistors (e.g., $R_{dump}$). In one aspect, a dump network blocks 832-A and 832-B may further include reactive components (e.g., inductors or capacitors, for example parasitic reactive components). In one aspect, a dump network block may be formed by one or more transistors.

For DAC A, one of the data switches (T1) in each set may receive an LSB portion of dataAp (DALp) signal at a gate terminal and the other transistor (T2) of the data switches 816-A in each set may receive an LSB portion of dataAn (DALn) signal. The dataAp and dataAn signals may be complementary to each other. For DAC B, one of the data switches (not shown) in each set may receive an LSB portion of a dataBp signal at a gate terminal and the other of the data switches in each set may receive an LSB portion of a dataBn signal. The dataBp and dataBn signals may be complementary to each other. The dataAp, dataAn, dataBp, and dataBn signals may be based on the bits received by the hybrid-mode DAC driver circuit 800. In an aspect, the combination of the LSB portions of two signal sets dataAp/dataAn and dataBp/dataBn form the desired portion of the analog signal associated with the LSBs.

In one or more implementations, DAC A and DAC B of the hybrid-mode DAC driver circuit 800 share a single load network that can be coupled to nodes OutP and OutN of the voltage-mode DAC driver 820.

The sets of data switches 816-A and 816-B are in a folded configuration relative to their respective interleaving blocks 830-A and 830-B. In an aspect, each set of data switches may include a pair of data switches (e.g., T1 and T2 of 816-A). Each pair of data switches may be connected to a respective interleaving block, a respective tail current source, and a respective set of second current sources. The drain nodes of each pair of data switches (e.g., T1 and T2 of 816-A) couples the pair of data switches to a respective interleaving block (e.g., 830-A) and a respective tail current source (812-A). A source node of each set of data switches (e.g., T1 and T2 of 816-A) couples the pair of data switches to a transistor of a respective second current source (e.g., of 814-A).

As described above, the interleaving blocks 830-A and 830-B, for each of DAC A and DAC B, may include dump switch blocks (e.g., 832-A and 832-B) and output switch blocks (e.g., 834-A and 834-B). Each dump switch block includes a respective set of dump switches and each output switch block includes a respective set of output switches. Each set of dump switches includes two dump switches. Each set of output switches may include two output switches.

The dump switches of each of DAC A (e.g., T3-B, T4-B) and DAC B (e.g., T5-A and T6-A) are connected to the respective one common dump network (of DAC A and DAC B), and may couple the data switches (of DAC A and DAC B) to the respective dump network (e.g., $R_{dump}$ of DAC A and DAC B). The output switches of each of DAC A (e.g., T3-A and T4-A) and DAC B (e.g., T5-B and T6-B) are connected to the voltage-mode DAC driver circuit 820 and may couple the data switches of DAC A (e.g., T1 and T2) and DAC B (not shown) to the voltage-mode DAC driver circuit 820. In an aspect, each of DAC A and DAC B includes N pairs of data switches, N interleaving blocks (e.g., including N pairs of dump switches and N pairs of output switches), two tail current sources, and N sets of second current sources.

In some aspects, a common MUX structure may be shared by the interleaved folded current-mode DAC driver circuit 810 and the voltage-mode DAC driver circuit 820. In an aspect, the voltage-mode DAC driver circuit 820 includes passive MUX circuits 822 and 824 before the SST inverters of the voltage-mode DAC driver circuit 820. The passive MUX circuit 822 allows one of DataAMp (DAMp) or DataBMp (DBMp) to be connected to the SST inverters of the P portion (e.g., connected to OutP) of the voltage-mode DAC driver circuit 820 depending on clock phases SELA or SELB. The passive MUX circuit 824 allows one of DataAMn (DAMn) or DataBMn (DBMn) to be connected to the SST inverters of the N portion (e.g., connected to OutN) of the voltage-mode DAC driver circuit 820 depending on clock phases SELA or SELB. The clock phases SELA and SELB may be referred to as selection signals or interleaving clock signals. The clock phases SELA and SELB are complementary to one another such that when one is in a high state, the other is in a low state. In an aspect, the clock phases may be voltage signals. As an example, in a high state, the clock phase may have a voltage level of between about 0.8 V and 1.0 V, and, in a low state, the clock phase may have a voltage level close to 0 V. For example, when SELA is in a low state (SELB is in a high state), DAMp and DAMn are applied to the voltage-mode DAC driver circuit 820. When SELB is in a low state (SELA is in a high state), DBMp and DBMn are applied to the voltage-mode DAC driver circuit 820, as further described with regard to FIG. 9.

In an aspect, the current-mode DAC driver circuit 810 may be interleaved by physically interleaving two sub-DAC-drivers (e.g., DAC A and DAC B). The dump switches (e.g., of 832-A and 832-B) and the output switches (e.g., of 834-A and 834-B) may be on or off depending on the clock phases SELA and SELB. For DAC A, when the clock phase SELA is in the low state (i.e., the clock phase SELB is in the high state), the output switches (e.g., T3-A and T4-A) biased by the clock phase SELA are switched on and tie the data switches (e.g., T1 and T2) to the voltage-mode DAC driver circuit 820, whereas the dump switches (e.g., T3-B and T4-B) biased by the clock phase SELB are switched off and do not connect the data switches (e.g., T1 and T2) to the dump network (e.g., $R_{dump}$). In this aspect, for DAC B, the output switches (e.g., T5-B and T6-B) biased by the clock phase SELB are switched off and do not tie the respective data switches (not shown) to the voltage-mode DAC driver circuit 820, whereas the dump switches (e.g., T5-A and T6-A) biased by the clock phase SELA are switched on and tie the respective data switches to the dump network (e.g., $R_{dump}$). In this aspect, DAC A is referred to as being active and DAC B is referred to as being inactive. In this regard, the current from DAC A is steered to the voltage-mode DAC driver circuit 820, and the output of the interleaved folded current-mode DAC driver circuit 810 is based on the current from DAC A. The current from DAC B is steered to the dump network associated with DAC B.

On the other hand, when the clock phase SELA is in the high state (i.e., the clock phase SELB is in the low state), DAC A is inactive and DAC B is active. In this case, the current from DAC B is steered to the voltage-mode DAC driver circuit 820, and the output of the current-steering DAC driver 810 is based on the current from DAC B. The current from DAC A is steered to the dump network associated with DAC A. In other words, in either operation (e.g., DAC A inactive and DAC B active, DAC A active and DAC B inactive), neither of the DAC currents (e.g., current from DAC A, current from DAC B) are truly turned off, allowing high speed operation.

The data is applied to the data switches (e.g., T1 and T2) in accordance with the clock phases SELA and SELB. For example, dataALp (DALp) and dataALn (DALn) may be applied to the data switches for DAC A in accordance with the clock phase SELA whereas dataBLp (DBLp) and dataBLn (DBLn) may be applied to the data switches for DAC B in accordance with the SELB. In the representation dataALp, dataBLp, dataALn, and dataBLn, L stands for the LSB. In an aspect, the interleaving may be operated at 32 GHz to allow 64 giga-samples per second (Gs/s) across the two sub-drivers. In this aspect, the period (e.g., edge to edge) of the clock phases SELA and SELB is 31.25 ps.

Although the interleaving factor is equal to two in FIG. 8, an interleaved DAC driver circuit may include more than two sub-DAC-drivers. For instance, in addition to DAC A and DAC B, the current-mode DAC driver 810 may further include sub-drivers DAC C and DAC D. Each of DAC C and DAC D may include similar components (e.g., data switches, dump switches, output switches, tail current sources, second current sources) as each of DAC A and DAC B. Each of DAC C and DAC D may include a respective dump network. DAC A, DAC B, DAC C, and DAC D may be connected to the voltage-mode DAC driver circuit 820. In an aspect, the number of clock signals utilized may be equal to the interleaving factor. At any time instant, the clock signals may cause one of the four sub-drivers to be active (e.g., supply current to the common load network) and the remaining three sub-drivers to be inactive (e.g., supply current to their respective dump network). The clock signals may cause each of the sub-drivers to be active 25% of the time and inactive the remaining 75% of the time. In an aspect, the number of sub-drivers may be increased to facilitate higher sampling rate $F_s$ for the DAC system. The interleaving factor utilized in the hybrid-mode DAC driver circuit 800 may be based on chip area considerations, power considerations, and/or clock signal routing considerations.

In some aspects, the utilization of interleaved folded current-mode DAC driver circuit 810 may provide high speed DAC designs that reduce or avoid effects pertaining, for instance, to power issues, headroom issues, and/or breakdown issues. The interleaved folded current-mode DAC driver circuit 810 may allow high speed DACs that may achieve higher sampling rates using a lower power supply for power savings. In an aspect, the interleaved architecture may allow high-speed operation. In an aspect, such as shown in FIG. 8, interleaving switches utilized in the interleaved architecture may be implemented in a folded cascode manner, which may alleviate risk associated with TDDB issues.

In one or more implementations, the subject technology may allow for a compact layout. In some aspects, the subject technology may provide a hybrid-mode DAC driver circuit in which MSB cells may be implemented using a voltage-mode DAC driver circuit (e.g., 820) and LSB cells may be implemented using a current-mode DAC driver circuit (e.g. 810). The voltage-mode DAC driver circuit 820 may be associated with the compact layout. The current-mode DAC driver circuit 810 may utilize smaller current cells when implemented as LSB rather than MSB. Each cell may refer to the components associated with a bit. For instance, an LSB cell of the current-mode DAC driver circuit 810 may refer to one set of data switches together with the tail current sources, second current sources, and cascode devices associated with the one set of data switches. An MSB cell of the voltage-mode DAC driver circuit 820 may refer to one of the parallel paths in the voltage-mode DAC driver circuit 820, which may include one or more buffering circuits and one or more resistors.

In one or more implementations, the subject technology may allow for large bandwidth (e.g., about 10 GHz within a range of about 15-20 GHz). In an aspect, the DAC circuit output is not loaded by active devices, which may facilitate the large bandwidth. In this regard, such as shown in FIG. 8, the output of the hybrid-mode DAC driver circuit 800 may see resistances but does not see active devices (e.g., the buffering circuits are not seen by the output).

In one or more implementations, the subject technology may allow for reduced return loss (e.g., within a range of about 12-20 dB). In an aspect, the purely resistive voltage-mode DAC driver circuit may provide a desired termination.

In one or more implementations, the subject technology may be implemented without the presence of large interleaver cascode transistors (e.g., associated with MSB cells). In these implementations, the clock buffers loading may be reduced, which may allow for lower power and/or improved phase noise (e.g., within the sub-pico second range) over a current-steering DAC implementation (e.g., implementation without a voltage-mode DAC driver circuit).

In one or more implementations, the subject technology may be applicable to not only differential inputs (e.g., datap and datan) but also a single-ended input.

In some aspects, the current-mode DAC driver circuit 810 may be associated with lower driver power, smaller driver size, and higher bit resolution. In some aspects, the voltage-mode DAC driver circuit 820 may be associated with larger inherent bandwidth, lower driver power, smaller driver size, lower return loss, smaller driver size, and higher linearity. In some aspects, the hybrid-mode DAC driver circuit may be associated with larger inherent bandwidth, lower driver power, smaller driver size, lower return loss, smaller driver size, higher linearity, and higher bit resolution.

Figure 9:
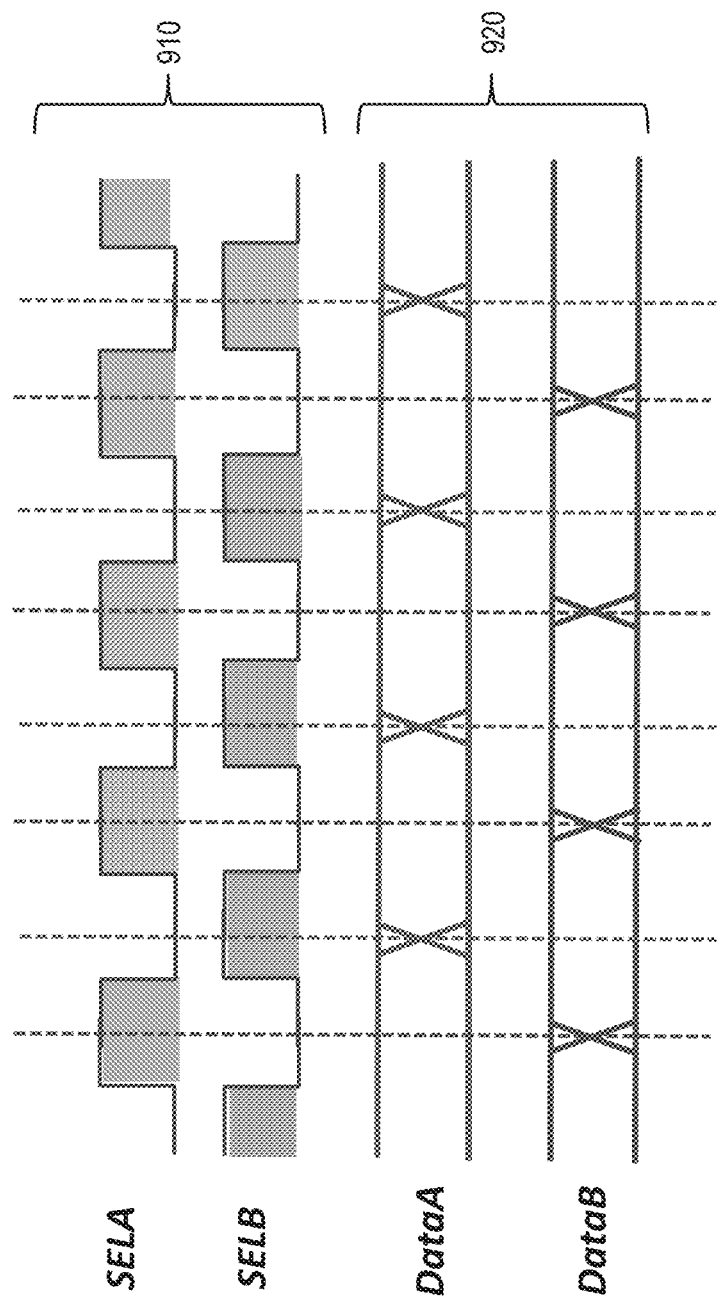
FIG. 9 illustrates examples of selection pulse trains and digital input data for the hybrid-mode DAC driver circuit of FIG. 8.

FIG. 9 illustrates examples of selection pulse trains 910 and digital input data 920 for the hybrid-mode DAC driver circuit 800 of FIG. 8. The selection pulse trains 910 include the selection signals (clock phases) SELA and SELB discussed above. As shown in FIG. 9, the selection signals SELA and SELB are complementary signals and each of them allow one set of data such as DataA and DataB to be applied to the hybrid-mode DAC driver circuit 800. DataA includes the LSB bits (e.g., DALp and DALn) and the MSB bits (e.g., DAMp and DAMn). Whereas, DataB includes the LSB bits (e.g., DBLp and DBLn) and the MSB bits (e.g., DBMp and DBMn). For example, when SELA is in a low state (SELB is in a high state), DAC A is active and DataA is applied to the hybrid-mode DAC driver circuit 800, and when SELB is in a low state (SELA is in a high state), DAC B is active and DataB is applied to the hybrid-mode DAC driver circuit 800.

Figure 10:
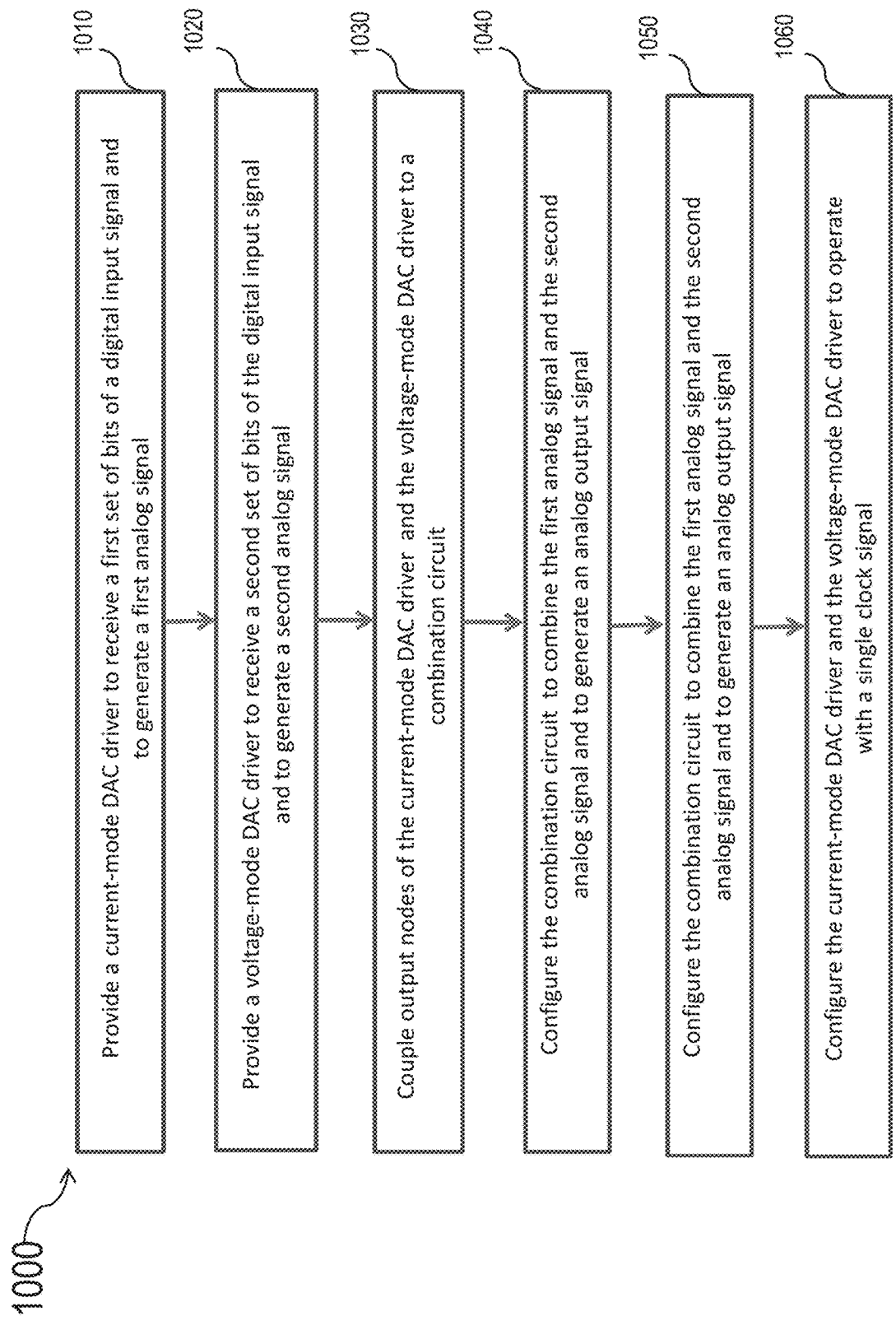
FIG. 10 illustrates an example method of providing a hybrid-mode DAC driver circuit.

FIG. 10 illustrates an example method 1000 of providing a hybrid-mode DAC driver circuit (e.g., 400 of FIGS. 4 and 800 of FIG. 8). The method 1000 includes providing a current-mode DAC driver (e.g., 200A of FIG. 2A or 200B of FIG. 2B) to receive a first set of bits of a digital input signal (e.g., Lbits of FIG. 4) and to generate a first analog signal (e.g., 412 of FIG. 4) (1010). A voltage-mode DAC driver (e.g., 420 of FIGS. 4 and 300 of FIG. 3) may be provided to receive a second set of bits (e.g., M bits of FIG. 4) of the digital input signal and to generate a second analog signal (e.g., 422 of FIG. 4) (1020). Output nodes of the current-mode DAC driver and the voltage-mode DAC driver may be coupled to a combination circuit signal (e.g., 430 of FIG. 4 and resistors R1 and R2 of FIG. 3) (1030). The combination circuit may be configured to combine the first analog signal and the second analog signal and to generate an analog output signal (1040). Resistor values (e.g., Rp of FIG. 3) of the voltage-mode DAC driver may be adjusted to achieve termination of the DAC driver circuit (1050). The current-mode DAC driver and the voltage-mode DAC driver may be configured to operate with a single clock signal (e.g., 132 of FIG. 1) (1060). The current-mode DAC driver and the voltage-mode DAC driver are differential drivers (e.g., see FIGS. 2A-2B and 3).

Various examples of aspects of the disclosure are described below as clauses for convenience. These are provided as examples, and do not limit the subject technology.

Clause A. A hybrid digital-to-analog converter (DAC) driver circuit, the circuit comprising: a current-mode DAC driver configured to receive a first set of bits of a digital input signal and to generate a first analog signal; a voltage-mode DAC driver configured to receive a second set of bits of the digital input signal and to generate a second analog signal; and a combination circuit configured to combine the first analog signal and the second analog signal and to generate an analog output signal, wherein: resistor values of the voltage-mode DAC driver are adjustable to provide termination of the DAC driver circuit, the current-mode DAC driver and the voltage-mode DAC driver comprise differential drivers, and the current-mode DAC driver and the voltage-mode DAC driver are configured to operate with a single clock signal.

Clause B. A method for providing a hybrid digital-to-analog converter (DAC) driver circuit, the method comprising: providing a current-mode DAC driver to receive a first set of bits of a digital input signal and to generate a first analog signal; providing a voltage-mode DAC driver to receive a second set of bits of the digital input signal and to generate a second analog signal; coupling output nodes of the current-mode DAC driver and the voltage-mode DAC driver to a combination circuit; configuring the combination circuit to combine the first analog signal and the second analog signal and to generate an analog output signal; adjusting resistor values of the voltage-mode DAC driver to provide termination of the DAC driver circuit; and configuring the current-mode DAC driver and the voltage-mode DAC driver to operate with a single clock signal, wherein the current-mode DAC driver and the voltage-mode DAC driver comprise differential drivers.

Clause C. An analog-to-digital converter DAC circuit comprising: a clock generator configured to generate a clock signal; a digital signal processor configured to generate a first digital signal at a first bit rate; a multiplexer circuit configured to receive the first digital signal and to generate a second digital signal at a second bit rate; and a DAC driver circuit configured to receive the second digital signal and the clock signal, wherein the DAC driver circuit comprises: a differential current-mode DAC driver configured to receive least significant bits (LSBs) of the second digital signal and to generate a first analog signal; a differential voltage-mode DAC driver configured to receive most significant bits (MSBs) of the second digital signal and to generate a second analog signal; and a combination circuit configured to combine the first analog signal and the second analog signal and to generate an analog output signal, wherein resistor values of the differential voltage-mode DAC driver are adjustable. In one or more aspects, examples of additional clauses are described below.

A method comprising one or more methods, operations or portions thereof described herein.

An apparatus comprising means adapted for performing one or more methods, operations or portions thereof described herein.

A hardware apparatus comprising circuits configured to perform one or more methods, operations or portions thereof described herein.

An apparatus comprising means adapted for performing one or more methods, operations or portions thereof described herein.

An apparatus comprising components operable to carry out one or more methods, operations or portions thereof described herein.

In one aspect, a method may be an operation, an instruction, or a function and vice versa. In one aspect, a clause may be amended to include some or all of the words (e.g., instructions, operations, functions, or components) recited in other one or more clauses, one or more words, one or more sentences, one or more phrases, one or more paragraphs, and/or one or more claims. During prosecution, one or more claims may be amended to depend on one or more other claims, and one or more claims may be amended to delete one or more limitations.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

In one aspect, a transistor may be a bipolar junction transistor (BJT), and it may refer to any of a variety of multi-terminal transistors generally operating on the principal of carrying current using both electrons and holes, including but not limited to an n-p-n BJT and a p-n-p BJT.

In one aspect, a transistor may be a field effect transistor (FET), and it may refer to any of a variety of multi-terminal transistors generally operating on the principals of controlling an electric field to control the shape and hence the conductivity of a channel of one type of charge carrier in a semiconductor material, including, but not limited to a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

In one aspect, the terms base, emitter, and collector may refer to three terminals of a transistor and may refer to a base, an emitter and a collector of a bipolar junction transistor or may refer to a gate, a source, and a drain of a field effect transistor, respectively, and vice versa. In another aspect, the terms gate, source, and drain may refer to base, emitter, and collector of a transistor, respectively, and vice versa.

Unless otherwise mentioned, various configurations described in the present disclosure may be implemented on a Silicon, Silicon-Germanium (SiGe), Gallium Arsenide (GaAs), Indium Phosphide (InP) or Indium Gallium Phosphide (InGaP) substrate, or any other suitable substrate.

What is claimed is:

1. A circuit apparatus for digital-to-analog conversion (DAC), the circuit apparatus comprising:
   a first-mode DAC driver circuit configured to receive a first digital input signal and to generate a first analog signal;
   a second-mode DAC driver circuit configured to receive a second digital input signal and to generate a second analog signal; and
   a combination circuit configured to receive the first analog signal and the second analog signal and to generate an analog output signal,
   wherein:
   the first-mode DAC driver circuit is connectable in parallel with the second-mode DAC driver circuit to a load network;
   the first-mode DAC driver circuit comprises an interleaved folded DAC driver circuit;
   the interleaved folded DAC driver circuit comprises: a first DAC circuit having first data switches and first interleaving blocks; and a second DAC circuit having second data switches and second interleaving blocks;
   the first interleaving blocks and the second interleaving blocks are connected to the second-mode DAC driver circuit and are connectable to the load network; and
   a mode of the first-mode DAC driver circuit is different from a mode of the second-mode DAC driver circuit.

2. The circuit apparatus of claim 1, wherein:
   the first-mode DAC driver circuit comprises a current-mode DAC driver circuit; and
   the second-mode DAC driver circuit comprises a voltage-mode DAC driver circuit.

3. The circuit apparatus of claim 1, wherein the first and second data switches are in a folded configuration relative to the first and second interleaving blocks.

4. The circuit apparatus of claim 1, wherein resistor values within the second-mode DAC driver circuit are adjustable to provide termination.

5. The circuit apparatus of claim 1, wherein each of the first-mode DAC driver circuit and the second-mode DAC driver circuit comprises differential circuits.

6. The circuit apparatus of claim 1, wherein the first-mode DAC driver circuit and the second-mode DAC driver circuit are coupled to, and are configured to operate using, a same clock generator circuit.

7. The circuit apparatus of claim 1, wherein:
   the first-mode DAC driver circuit comprises a current-steering DAC driver circuit implemented in current-mode logic; and
   the current-steering DAC driver circuit comprises a tail current array formed of current sources configured to have different current values.

8. The circuit apparatus of claim 7, wherein:
   the current-steering DAC driver circuit comprises the first data switches having an array of differential data switches; and
   each differential data switch pair of the array of differential data switches is coupled to a respective current source of the current sources and is configured to receive a differential bit pair of the first digital input signal.

9. The circuit apparatus of claim 8, wherein:
   the current-steering DAC driver circuit comprises the second data switches having an array of circuit pairs; and
   each circuit pair of the array of circuit pairs is coupled to a respective differential data switch pair of the array of differential data switches.

10. The circuit apparatus of claim 1, wherein the second-mode DAC driver circuit occupies a chip area of greater than 10 μm² and less than approximately 1000 μm².

11. The circuit apparatus of claim 1, wherein:
the first-mode DAC driver circuit comprises a folded current-steering DAC driver circuit comprising a folded array of differential data switches;
the folded array of differential data switches is coupled in parallel with an array of circuit transistor pairs to a pair of current sources;
the first data switches comprise the folded array of differential data switches; and
the second data switches comprise the array of circuit transistor pairs.

12. The circuit apparatus of claim 1, wherein:
the first-mode DAC driver circuit comprises a first folded current-steering DAC driver circuit and a second folded current-steering DAC driver circuit;
the first folded current-steering DAC driver circuit comprises a first folded array of differential data switches, a first set of dump switches, and a first set of output switches;
the second folded current-steering DAC driver circuit comprises a second folded array of differential data switches, a second set of dump switches, and a second set of output switches;
differential output nodes of the first set of output switches and the second set of output switches are coupled to differential output nodes of the second-mode DAC driver circuit;
the first data switches comprise the first folded array of differential data switches;
the first interleaving blocks comprise the first set of dump switches and the first set of output switches;
the second data switches comprise the second folded array of differential data switches; and
the second interleaving blocks comprise the second set of dump switches and the second set of output switches.

13. The circuit apparatus of claim 1, wherein:
the second-mode DAC driver circuit includes a pair of input multiplexers; and
each multiplexer of the pair of input multiplexers is configured to couple a first or a second digital signal to respective input nodes of the second-mode DAC driver circuit.

14. The circuit apparatus of claim 1, wherein:
the combination circuit comprises an input impedance of a circuit receiving the analog output signal; and
the input impedance comprises a differential impedance.

15. The circuit apparatus of claim 1, wherein:
the first-mode DAC driver circuit and the second-mode DAC driver circuit are configured to operate using one of binary coded or thermometer coded digital signals; and
the first digital input signal comprises least significant bits of a digital signal, and the second digital input signal comprises most significant bits of the digital signal.

16. A method for operating a digital-to-analog conversion (DAC) apparatus, the method comprising:

acquiring, by a first-mode DAC driver circuit, a first digital input signal and generating a first analog signal;
acquiring, by a second-mode DAC driver circuit, a second digital input signal and generating a second analog signal; and
combining the first analog signal and the second analog signal and generating an analog output signal,
wherein:
the first-mode DAC driver circuit is connectable in parallel with the second-mode DAC driver circuit to a load network;
the first-mode DAC driver circuit comprises an interleaved folded DAC driver circuit;
the interleaved folded DAC driver circuit comprises: a first DAC circuit having first data switches and first interleaving blocks; and a second DAC circuit having second data switches and second interleaving blocks;
the first interleaving blocks and the second interleaving blocks are connected to the second-mode DAC driver circuit and are connectable to the load network; and
a mode of the first-mode DAC driver circuit is different from a mode of the second-mode DAC driver circuit.

17. The method of claim 16, wherein:
the first-mode DAC driver circuit operates in a current mode; and
the second-mode DAC driver circuit operates in a voltage mode.

18. The method of claim 16, wherein the first and second data switches are in a folded configuration relative to the first and second interleaving blocks.

19. The method of claim 16, wherein resistor values within the second-mode DAC driver circuit are adjustable to provide termination.

20. The method of claim 16, wherein:
the first-mode DAC driver circuit comprises a first folded current-steering DAC driver circuit and a second folded current-steering DAC driver circuit;
the first folded current-steering DAC driver circuit comprises a first folded array of differential data switches, a first set of dump switches, and a first set of output switches;
the second folded current-steering DAC driver circuit comprises a second folded array of differential data switches, a second set of dump switches, and a second set of output switches;
differential output nodes of the first set of output switches and the second set of output switches are coupled to differential output nodes of the second-mode DAC driver circuit;
the first data switches comprise the first folded array of differential data switches;
the first interleaving blocks comprise the first set of dump switches and the first set of output switches;
the second data switches comprise the second folded array of differential data switches; and
the second interleaving blocks comprise the second set of dump switches and the second set of output switches.

* * * * *